United States Patent [19]
Hundrieser

[11] Patent Number: 4,652,848
[45] Date of Patent: Mar. 24, 1987

[54] FUSIBLE LINK

[75] Inventor: Dieter H. Hundrieser, Kemptville, Canada

[73] Assignee: Northern Telecom Limited, Montreal, Canada

[21] Appl. No.: 871,280

[22] Filed: Jun. 6, 1986

[51] Int. Cl.⁴ .................. H01H 85/04; H02H 7/20
[52] U.S. Cl. ........................... 337/297; 337/4;
337/405; 361/104; 361/402
[58] Field of Search ............... 337/297, 405, 402, 403,
337/404, 232, 4, 152, 153, 166; 361/104, 402;
219/517, 523

[56] References Cited
U.S. PATENT DOCUMENTS 4,031,497  6/1977  Ozawa ........................ 337/297
4,379,318  4/1983  Ootsuka ...................... 337/297

Primary Examiner—Harold Broome
Attorney, Agent, or Firm—Schwartz, Jeffery, Schwaab, Mack, Blumenthal & Evans

[57] ABSTRACT

A fusible link for an electrical circuit consists of a length of fusible material which closely fits an aperture through a ceramic printed circuit board. Ends of the fusible element electrically contact respective electrical leads on opposed surfaces of the board. A resistive film forming part of the electrical circuit is located close to the fusible link site so that when overvoltage conditions exist the resistive film heats the circuit board until eventually the fusible material melts, flows out of the aperture and the electrical circuit is broken. The fusible link is soldered and/or swaged into position and projects beyond the surface of the circuit board so that when the solder melts, surface tension forces tend to pull the solder out of the aperture.

8 Claims, 6 Drawing Figures

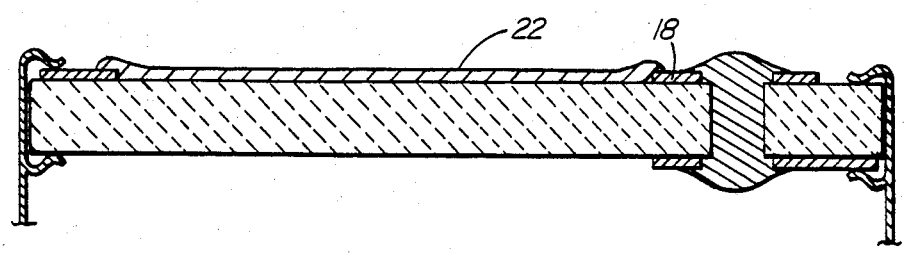
FIG. 4
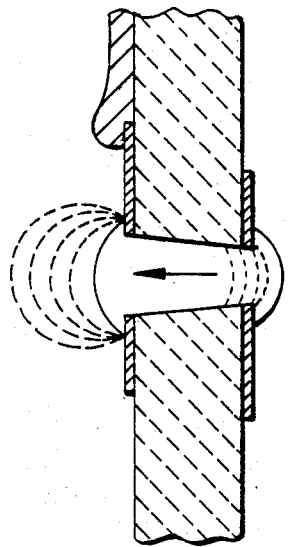 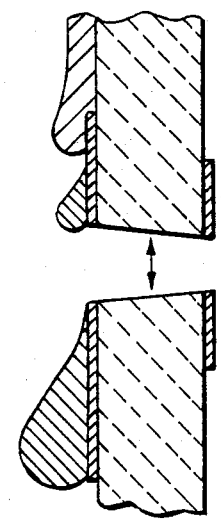
FIG. 5  FIG. 6

FUSIBLE LINK

This invention relates to a fusible link which acts to break and electrical circuit of which the link forms part in the event of a high fault voltage.

Battery feed resistors serve in part to protect sensitive electronic telephone line circuits from external fault conditions such as intermittent or steady state fault voltages. Such voltages may cause the resistors to dissipate power levels which are hazardous to the system. It is desirable to have a controlled "fail safe" mechanism which, in effect, disconnects the line circuit from such fault voltages.

In order to implement the overvoltage protection, various approaches have been tried, such as thermistors, gas tubes, bimetallic switches, and solid state devices. Generally such techniques have not been fully successful owing variously to expense, bulkiness and questionable reliability and performance.

A further method of providing overvoltage protection is by fusible links.

Known fusible link technologies suffer from several deficiencies. Firstly, to be effective the fusible link must be subjected to a temperature which is accurately related to the power dissipated within the electrical circuit. Frequently the heating of the fusible link by the resistive film and associated substrate is indirect and difficult to control because they are not in intimate contact with the power dissipating element.

Metallic fusible links are prone to oxidation if they are maintained at high temperature during normal circuit operation. To avoid the problems of oxidation, it is necessary to provide firstly a coating of flux to remove the oxides during operation and then a second coating of solvent protection over the flux coating to avoid working off the flux during various cleaning processes.

In other types of fusible link, if the fuse is positioned externally of the circuit board and reaches high temperature, emission of hot particles may occur. Hot particle emission can result in other system failures due to the fire hazard and/or shorting of circuit elements.

Generally known fusible links require a specially tooled lead frame to connect the fusible link and much additional manual labor to assemble the link to the lead frame.

According to the invention, there is provided a fusible link for an electrical circuit, the fusible link formed at an aperture through a ceramic printed circuit board, the link being a length of fusible metal having a close fit within said aperture wherein one end of said fusible metal length is electrically connected to a circuit lead on one side of the board and the other end of said length is electrically connected to a circuit lead on the opposite side of the board, and a resistive film located adjacent said link and together with said link and said circuit leads being connected into said circuit, said resistor adapted to heat the fusible metal to its melting point when the circuit is subjected to an overvoltage condition.

Preferably the fusible metal length is swaged into position within the aperture to establish a close fit and thereby good thermal coupling between the circuit board and the fusible metal. The fusible metal link may additionally be soldered at opposed ends to the circuit leads.

Preferably the circuit board is made of a ceramic material having a high thermal capacity. The resistive film can be located closely adjacent to the fusible link whereby the heat generated by current passing through the resistive film raises the temperature of an adjacent part of the circuit board and thereby raises the temperature of the fusible metal or solder link. As a threshold power is dissipated within the resistive film, the solder link melts, flows out of the aperture and so breaks the electrical circuit.

Preferably the length of solder projects beyond the aperture by an amount sufficient that when the solder melts, surface tension forces act to force a part of the melted solder outside the aperture into a ball and so draw further solder from inside the aperture. The aperture can be a circular hole and can be tapered to encourage the action of surface tension in drawing the molten solder from the aperture.

A metal pad can be formed on the circuit board surrounding the fusible link whereby when molten solder flows from the aperture, it flows initially over the metal pad and is thereby encouraged to solidify.

An embodiment of the invention will now be described by way of example, with reference to the accompanying drawings, in which:

FIG. 4 is a sectional view through a printed circuit board showing the board having a fusible link according to the invention; and FIGS. 5 and 6 are sectional views through a fusible link as the link is broken.

Figure 1:
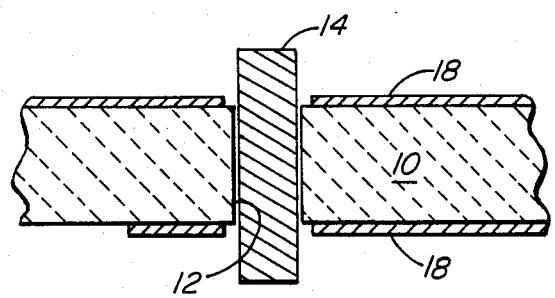
FIG. 1 shows a first stage in the formation of a fusible link according to the invention.
Figure 2:
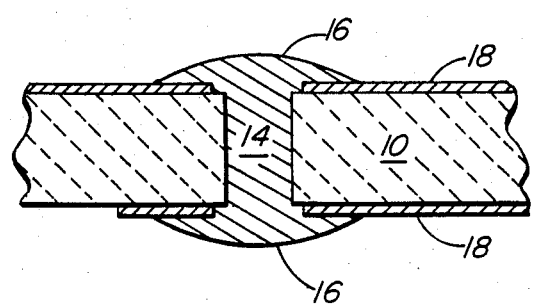
FIG. 2 shows a subsequent stage in the formation of a fusible link.

Referring to the drawings in detail, FIG. 1 shows part of a circuit board 10, the circuit board being a 0.1 inch thick ceramic substrate with a 0.055 inch diameter laser drilled hole 12 extending therethrough. Into the hole is inserted a 0.05 inch diameter rosin flux core 60/40 tin/-lead solder wire 14. The solder wire is swaged into place to spread the solder ends 16 over respective electrical leads 18 at opposed surfaces of the circuit board (FIG. 2).

Figure 3:
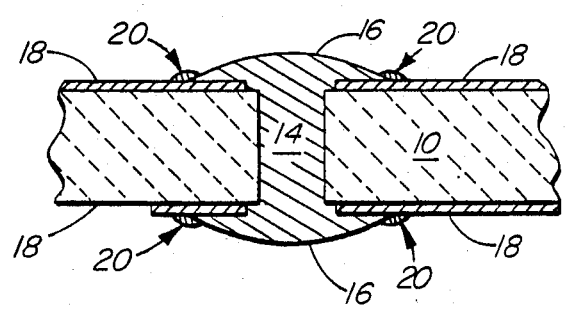
FIG. 3 shows a further stage in the formation of the fusible link somewhat different from that shown in FIG. 2.

As an alternative, or in addition to, swaging the solder in place within an aperture through the circuit board, the solder link can be held within the aperture and solder 20 applied to each end of the link to solder the link ends 16 to the adjacent conducting leads 18 (FIG. 3). The second method is clearly somewhat slower than the first although thermal coupling achieved by the second method is better.

As shown in FIG. 4, in operation, the fusible link, lies close to a resistive film 22 which forms part of the electrical circuit which is to be protected by the fusible link. The film is deposited over the conducting lead 18 to establish electrical continuity between the resistive film 22 and the solder of the fusible link 14. When current is passed through the electrical circuit, the resistive film 22 is heated and thermal coupling takes place from the resistive film 22 to the ceramic substrate 10 and then to the solder of the fusible link 14.

Eventually, when a high enough temperature is reached, the solder melts. As shown in FIG. 5, by using an amount of solder which causes the solder link 14 to project slightly beyond the ends of the hole 12, outflow of molten solder from the hole is encouraged by surface tension forces which form as soon as the solder melts.

The surface tension tends to reshape the solder at the surface of the circuit board into a ball. As a result of the surface tension forces, solder is drawn from inside the hole. Eventually, the continuity of solder through the hole 12 is broken and the ball of solder drops away from the mouth of the aperture and onto the metallization 18 surrounding the hole. To encourage outflow of molten solder, the hole 12 can be tapered somewhat as shown in FIG. 5.

The molten solder tends to flow along the outside surface of the board 10 once it exits the hole 12. To ensure that the molten solder does not travel to a location where it could cause a short or otherwise damage the electrical circuit, the board can have a metal pad closely adjacent to the fusible link site so that as the molten solder exits the hole 12 it flows along the surface of the metal pad and quickly solidifies.

Typically the solder used is a 60/40 tin/lead solder having a melting point of 183° C. However by choosing different fusible alloys, the fusible link can be made to fuse at higher or lower temperatures. Thus to achieve low temperature melting the fusible alloy can include indium. The thermal capacity of the circuit board adjacent to the fusible link site is sufficiently high that as the fusible link melts, the solder stays molten long enough for it to flow out of the aperture to break the electrical circuit.

As previously indicated, a particular advantage of this type of fusible link is that since the solder wire is swaged into the hole, good thermal coupling results between the ceramic or other circuit board body and the solder, this thermal coupling being minimally influenced by external drafts, heat sinks, etcetera. Moreover the solder within the hole is protected from oxidation as it is sealed off from the air.

What is claimed is:

1. An electrical circuit having a fusible link, the fusible link formed at an aperture through a printed circuit board, the link being a length of fusible alloy having a close fit within said aperture wherein one end of said fusible alloy length is electrically connected to a circuit lead on one side of the board and the other end of said length is electrically connected to a circuit lead on the opposite side of the board, and a resistive film located adjacent said link and, together with said link and said circuit leads, being connected into said circuit, said resistive film adapted to heat the fusible alloy to its melting point when the circuit is subjected to an overvoltage condition.

2. A circuit as claimed in claim 1 wherein the circuit board is made of a ceramic material having a high thermal capacity.

3. A circuit as claimed in claim 1 in which the fusible alloy length is swaged into position within the aperture whereby the fusible alloy length is a close fit within the aperture.

4. A circuit as claimed in claim 3 wherein the length of fusible alloy projects beyond the aperture at opposed surfaces of the circuit board.

5. A circuit as claimed in claim 4 wherein the extended projection of the fusible alloy length beyond the circuit board surface is such that on melting of the fusible alloy, surface tension forces within the fusible alloy tend to draw melted fusible alloy outside the aperture into a ball and so further draw fusible alloy from inside the aperture.

6. A circuit as claimed in claim 5 wherein the aperture is a circular hole.

7. A circuit as claimed in claim 6 wherein the aperture tapers from one surface of the board to the opposed surface thereof.

8. A circuit as claimed in claim 5 wherein the fusible alloy is 60/40 tin/lead solder.

* * * * *